United States Patent [19]

Spreitzhofer

[11] 3,774,018

[45] Nov. 20, 1973

[54] MULTI-RANGE SIGNAL INTEGRATOR WHICH CHANGES RANGE ONLY AT SPECIFIC TIMES

[75] Inventor: Ernst Spreitzhofer, Nussdorf, Germany

[73] Assignee: Bodenseewerk Perkin-Elmer & Co., GmbH, Ueberlingen/Bodensee, Germany

[22] Filed: Dec. 8, 1971

[21] Appl. No.: 205,797

[30] Foreign Application Priority Data

Dec. 10, 1970 Germany .................. P 20 60 786.7

[52] U.S. Cl. ....... 235/183, 235/92 NT, 235/151.35, 340/347 NT

[51] Int. Cl. .............................................. G06g 7/18

[58] Field of Search ....................... 235/151.35, 183, 235/92 NT, 92 PB; 340/347 NT; 307/244

[56] References Cited

UNITED STATES PATENTS

| | | | |
|---|---|---|---|
| 3,337,722 | 8/1967 | Siess et al. | 235/151.35 X |
| 3,470,367 | 9/1969 | Frisby et al. | 235/151.35 X |
| 2,860,261 | 11/1958 | Verkruissen | 307/244 |
| 2,870,348 | 1/1959 | Chao | 307/244 |
| 3,187,197 | 6/1965 | Ekiss | 307/244 |
| 3,207,916 | 9/1965 | Slow | 307/244 |
| 3,335,292 | 8/1967 | Alburger | 307/244 |
| 3,446,989 | 5/1969 | Allen et al. | 307/244 |
| 3,602,738 | 8/1971 | Bohm | 307/244 |
| 3,622,769 | 11/1971 | Lajoie et al. | 235/183 |

OTHER PUBLICATIONS

Harrison: Four Ramp Integrating Analog to Digital Converter. IBM Tech. Discl. Bull. Vol. 11, No. 2, July 68, p. 191–192.

*Primary Examiner*—Felix D. Gruber
*Attorney*—Edward R. Hyde, Jr.

[57] ABSTRACT

A known multirange integrator includes a multistep voltage divider (e.g., 1, 1/10, 1/100) for the input signal, an analog-to-digital converter for generating counting pulses at a frequency proportional to the (divided) input voltage, a final counter for these pulses, and a multistep switching arrangement for effectively multiplying the "weighting" of the pulses by a factor (e.g., 1, 10, 100) to counteract the effect of the input voltage divider (as by supplying the pulses to different stages of a, say, decade counter). The analog-to-digital converter may be a resettable integrator which supplies a counting pulse when its output reaches a preset value, the integrator being simultaneously reset by supplying a reset signal (of standardized voltage and time) to its input. The improvement insures that range switching (of the input divider and output "weighting" switching arrangement) does not occur during the production of a counting pulse by the resettable integrator, which would cause the input signal to be (at least in part) integrated as divided by one factor and the resulting pulse later counted at a different weighting factor. In particular, although the range chosen is dependent on the amplitude of the input signal, actual switching to a new range occurs only when a counting pulse is generated, thereby occurring during the integration reset interval. This switching may be caused by flip-flops setting each range, which flip-flops are enabled by a logic circuit and limit switches reading the input level, but which actually change state only upon occurrence of a counting pulse.

3 Claims, 3 Drawing Figures

PATENTED NOV 20 1973 3,774,018

INVENTOR
Ernst Spreitzhofer
BY Daniel K. Levenson
ATTORNEY.

MULTI-RANGE SIGNAL INTEGRATOR WHICH CHANGES RANGE ONLY AT SPECIFIC TIMES

This invention relates to a device for the time integration of an original input voltage to be measured comprising an input voltage divider (acting to change the range) switchable in steps across which the original input voltage is applied, an integrator which supplies a counting pulse whenever a preset value of the integrated output voltage is reached, and which is then reset to zero, thus acting as a voltage-to-frequency converter for converting the voltage derived from the input as affected by the voltage divider to a counting pulse frequency proportional thereto, a counter which responds to each counting pulse of this output through a similar counting range or valency switch, and limit value switches by which an opposite (in relative value) switching of the input voltage divider and output counting range or valency switch (i.e., final measuring range switching) is effected when preset values (corresponding to the change-over values between the various ranges) of the measuring voltage are exceeded.

Circuit arrangements of the type indicated are prior art, for instance, in German Pat. No. 1,294,052, corresponding to U.S. letters Pat. No. 3,313,924, issued Apr. 11, 1967, the disclosure of which is herein incorporated by reference. In such voltage-to-frequency converters, (see FIG. 1 of this patent), the input signal is commonly integrated by a Miller integrator (24, 28) up to a threshold value. When this threshold value is reached by the output (32) of the Miller integrator, a counting pulse is thereby supplied, (at the output of impulse former 38) while at the same time a standard reset signal having a standardized voltage-time area is then applied to the input of the integrator to effect a reset integration (back to some reset level). In the integrator of the patent, this resetting is accomplished by the firing of a glow lamp 36 at its threshold (firing potential) value until the voltage is reduced to the cut-off potential of the lamp; other techniques however may be used to effect this resetting of the integrator back to a starting or reset voltage level. In order to insure that the voltage-to-frequency conversion by the integrator is substantially linear (in particular to insure that the reset times remain a very small part of the total integration and reset cycle), a range change technique is employed. Basically this consists in dividing the input signal by a factor (e.g., by 10) when the signal increases beyond a certain value and simultaneously effectively multiplying the output (as by supplying it to the next decade stage of the counter 40 in the patent) by the same factor. In the prior patent just referred to, the measuring ranges include two attenuation ranges (dividing input by 10 and 100 respectively) besides the unattenuated range (divide by 1) provided by a multi-range voltage divider 12. In such prior art arrangements for accomplishing the measuring range switching, the switching can occur at any instant of the integration and reset (integration) cycle. Thus it may happen that the measuring range switching takes place at an instant in which the output of the Miller integrator had risen to a value just below the threshold value for generating a counting pulse. In such a case there will be an overrating or underrating of the counting pulse generated immediately thereafter. If, for instance, the integration of an input signal, $U_e$, is effected at a measuring range factor "1", then the full signal will be integrated by the Miller integrator and each counting pulse in the final output counter will be given the value "1". Now if shortly prior to reaching the threshold value at the output of the Miller integrator, switching is effected to the measuring range factor "10", then the counting pulse appearing shortly thereafter will be given the value "10" by the counter, i.e., applied to the "tens" input of the final counter though it is based substantially on an integration of the full signal, thus causing this part of the input signal to be "overrated" or overvalued. For the next following pulse this valuation is correct again, since this next pulse, after switching of the voltage divider, is based on an integration of the input signal U with its amplitude attenuated or reduced by the factor "10" (so that it should be multiplied at the output by 10). However, the switching in the middle of the previous cycle has caused an error in the integral, which in general is a significant error.

It is an object of this invention to so devise a device of the type indicated at the beginning of this specification, wherein an overrating or undervaluing of counting pulses caused by an inappropriate particular instant of switching of the measuring range is avoided.

According to the invention this object is attained by providing that the measuring range switching, although effectively controlled in response to limit value switch signals, is actually effected only by the occurence of a counting pulse.

Thus, according to this invention, switching of the measuring range is not effected directly by the limit value switch signals (which determine when the input level is within an appropriate range for switching), but the actual switching is effected by a counting pulse, whereas the limit value switch signals only determine whether the next counting pulse shall cause such a switching of the range or not. Thereby, it is insured that a switching of the measuring range can take place only at the beginning of the reset integration, and each counting pulse generated is counted with that digit value (e.g., 1, 10, or 100) which corresponds to the preceding integrating action and the associated input voltage divider switch position (e.g., divide by 1, 10 or 100, respectively).

The object of this invention can be accomplished by causing the measuring range switching to be effected through flip-flops (FF1, FF2, FF3) which are switched by counting pulses, while the flip-flops are put in readiness for switching by the limit value switches ($K_1$, $K_2$) through a logic circuit (I1, I2, G1, G2, G3), the limit value switches changing their states in response to the required measuring range.

An illustrative embodiment of this invention will now be described more fully with reference to the accompanying drawings, in which.

Figure 1:
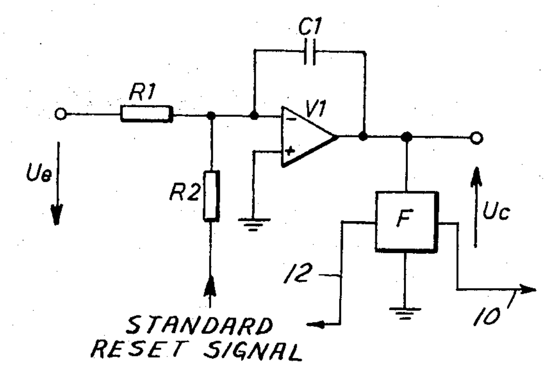
FIG. 1 shows a voltage-to-frequency converter in the form of an integrator provided with reset integration.
Figure 2:
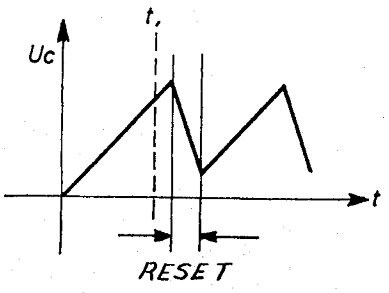
FIG. 2 shows the respective waveform of the output signals of the FIG. 1 integrator.

Referring now to FIG. 1, the voltage-to-frequency converter comprises an integrating stage including an amplifier VI with high gain, an ohmic input resistor R1 through which an input voltage $U_e$ is applied across the amplifier, and a capacitor C1 in the negative feedback circuit. A circuit of the type indicated is a so-called "Miller integrator," and the output signal $U_c$ is equal to the time integral of the input signal $U_e$. When the output signal $U_c$ has reached a predetermined threshold value, then a comparator or sensor F causes two actions to occur: (1) a counting pulse at 10 is supplied to a final counter, and (2) a reset signal having a standardized voltage-time area is caused at 12 to be applied to the input of the amplifier VI through resistor R2 for the reset integration. In the patent previously referred to, the first function (of supplying a counting pulse) is performed by impulse former 38 and the second function (of resetting the integrator) is effectively performed directly by the glow lamp 36. Then, at the output of the integrating stage a signal waveform $U_c$ is obtained such as illustrated in FIG. 2, and pulses are generated (e.g., at each peak, corresponding to the threshold value) whose frequency is proportional to the input signal $U_e$ and each of which corresponds to a time integral of $U_e$ equal to the resetting standardized voltage-time area.

By way of example, as has been described in the aforementioned German Pat. No. 1,294,052 (corresponding to U.S. Pat. No. 3,313,924) a voltage divider at the input can cause attenuating or dividing of the original input signal by factors of, for instance, 10 or 100, so that $U_e$ actually integrated is in a favorable range for the integrating stage even for the case of high original voltages desired to be measured. Because of this input signal division, the pulses then obtained are counted into the counter at the output with an accordingly higher digit value (e.g., 10 or 100, respectively) so that the final counter measures proportionally the original input (i.e., takes into account the voltage division by corresponding output "multiplication").

Now, if, in a device such as shown in the above referred to U.S. Pat. No. 3,313,924 for instance, switching takes place at an instant $t_1$ (FIG. 2) shortly prior to reaching the threshold value, then the counting pulse generated shortly thereafter will be counted by the counter, for instance, with the digit value "10" (assuming switching of the input divider and output "multiplier" to a value of 10) even though until the instant $t_1$ the integration had not taken place with a measuring voltage attenuated by the factor 10. To avoid this, the circuit illustrated in FIG. 3 has been provided for causing switching of the measuring range.

Figure 3:
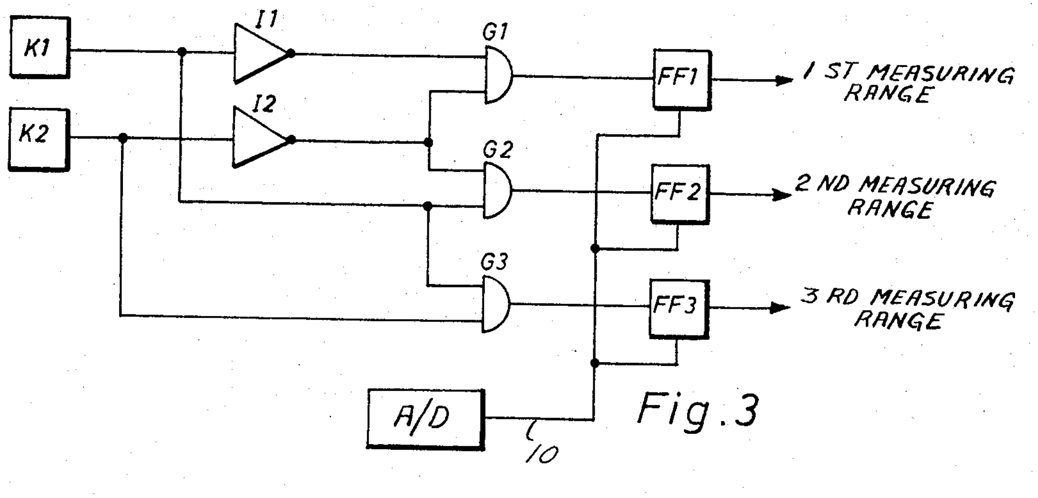
FIG. 3 shows an example of a range selecting circuit arrangement incorporating the invention.

In FIG. 3 the reference characters $K_1$ and $K_2$ designate two limit value switches responding to the possible three input ranges by assuming the output states given by the following logic table:

| Measuring Range | K1 | K2 |
|---|---|---|
| 1 | 0 | 0 |
| 2 | 1 | 0 |
| 3 | 1 | 1 |

Switching of the measuring ranges is effected by three flip-flops FF1, FF2, and FF3. The flip-flops FF1 to FF3 are energized by the parallel supplied counting pulses of the voltage-to-frequency converter, by output 10 of sensor F which however only changes that flip-flop which has been put into readiness for switching through its respective control input. AND elements $G_1$, $G_2$, and $G_3$ are connected to these control inputs. The AND elements $G_1$, $G_2$, and $G_3$ are controlled by the limit value switches as follows.

To one input of the first AND element $G_1$ the limit value switch $K_1$ is connected through an inverter stage $I_1$, and to the other input of the AND element $G_1$ the limit value switch $K_2$ is connected through a second inverter stage $I_2$. The limit value switch $K_2$ is connected indirectly to one input of the second AND element $G_2$ through the inverter stage $I_2$, and the limit value switch $K_1$ is connected (directly) to the other input of the second AND element $G_2$. The limit value switch $K_1$ is connected directly to one input of the third AND element $G_3$, and the limit switch $K_2$ is also connected directly to the other input of the third AND element $G_3$.

The following truth table is obtained for the time interval $t_n$ prior to the switching counting pulse (i.e., a peak in FIG. 2), and for the time interval $t_{n+1}$ after this counting pulse.

| $K_1$ | $K_2$ | FF1 | FF2 | FF3 |
|---|---|---|---|---|
| $t_n$ | | $t_{n+1}$ | | |
| 0 | 0 | 1 | 0 | 0 |
| 1 | 0 | 0 | 1 | 0 |
| 1 | 1 | 0 | 0 | 1 |

Thus, the correct switching is obtained if FF1 switches on the first (lowest) measuring range, FF2 the second measuring range, and FF3 the third (highest) measuring range, e.g., divide input and multiply output (by supplying appropriate location in final counter) by, say, 1, 10 and 100, respectively.

The operation of the logic circuit can readily be verified as correct. For example, for the first (lowest input signal lead) measuring range, the following occurs. For an input that is in the lowest or first measuring range (the output states of) $K_1$ and $K_2$ are both equal to 0. The (output states of the) inverter stages I1 and I2 are therefore both 1.

The AND element G1 (output state) is 1, while G2 and G3 supply 0 across their outputs. FF1 is ready to switch, and when the counting pulse at the beginning of the reset integration occurs, FF1 assumes the state "1". This sets the range of both the input divider and output multiplier to the lowest input range (e.g., divide and multiply by 1, respectively). Analogous action occurs for the second and the third measuring range, to switch on the second and third flip-flops FF2 and FF3, respectively (to cause input division and output multiplication by, say, 10 and 100 respectively) when the input level is in the intermediate (i.e., exceeds the actuating value of K1 but not K2) and high (i.e., exceeds the higher actuating value of K2 as well) range, respectively. The limit value switches K1 and K2 may be actuated by simple threshold comparators for determining when the original input signal (prior to the divider) reaches (or exceeds) each of two values (e.g., Vo and 10 Vo) corresponding to the desired switching from the lowest to the middle range, and from the intermediate to the highest (third) range, respectively. The original input signal corresponds to the signal U applied to the input terminal 10 (before divider 12) in FIG. 1 of the aforementioned U.S. Pat. No. 3,313,924.

I claim:

1. In a multirange input signal integrator of the type comprising in series: a switchable multistep input voltage divider, an integrating stage, means supplying a counting pulse whenever a preset value of the output of the integrating stage is reached and for simultaneously supplying a reset signal to return the integrating stage to its nominal zero level, said integrating stage and reset signal supplying means therefore acting as voltage-to-frequency converter to generate counting pulses at a frequency proportional to the amplitude of the input voltage after division by the voltage divider, a pulse counter having a multistep count-weighting switching means so as to count said pulses as effectively multiplied by a factor equal to the division factor of said multistep input voltage divider, and means for causing ganged switching of both said multistep input voltage divider and said multistep count-weighting switching means when different ranges of the input voltage to be measured are reached, without effecting the overall proportionality between the undivided input voltage and the final count of the counter, the improvement comprising:

said means for causing said ganged switching comprises, in addition to means responsive to the value of said input voltage, (K1, K2) initialing means (FF1, FF2, FF3) responsive to said counting pulse, said ganged switching causing means being of such construction that said initiating means actually causes switching of said multistep input voltage divider and said multistep count-weighting switching means only at the time of occurrence of said counting pulse, whereby the range changing always occurs when said integrating stage is reset, thereby avoiding error which would be caused by partial integration of an input signal at one setting of the voltage divider and count-weighting switching means and count-weighting at a different setting of said switching means.

2. In a multirange input signal integrator according to claim 1, in which said means for causing said ganged switching comprises:

limit value switches (K1, K2) responsive to the level of the input signal;

flip-flops (FF1, FF2, FF3) for controlling the various steps of both said multistep input voltage divider and said multistep count-weighting switching means;

logic circuitry (I1, I2, G1, G2, G3) for connecting the outputs of said limit value switches to the enabling inputs of said flip-flops;

and means (10) supplying said counting pulses to the actuating inputs of said flip-flops, whereby said flip-flops actually change their state only upon occurrence of a counting pulse, although they are generally controlled by the input signal level as determined by said limit value switches and logic circuitry.

3. In a multirange input signal integrator according to claim 2, in which:

said limit value switches comprise a first limit switch (K1) which changes its state whenever the input signal level crosses an intermediate value between a first and second measuring range, and a second limit switch (K2) which changes its state whenever the input signal level crosses a higher value between the second and a third measuring range;

said logic circuitry comprises: first and second inverters (I1, I2) having their inputs connected to the output of, respectively, said first and second limit switches; first, second and third AND gates (G1, G2, G3), the two inputs of the first (G1) of which receives the outputs of each of said inverters, the two inputs of the second (G2) of which receives the output of said first limit switch and the output of said second inverter, and the two inputs of the third (G3) of which receives the output of each of said limit switches, so that the output of each AND gate assumes a particular stage when said input signal is in a corresponding one of said first, second or third measuring range;

the outputs of each of said AND gates being connected to the enabling input of a corresponding one of said flip-flops, whereby when the input signal level crosses from one measuring range to another, these two flip-flops corresponding to the two involved ranges will each change their states upon the occurrence of the next succeeding counting pulse so as to change the integration range by switching the multistep voltage divider and multistep count-weighting switching means from the step corresponding to the previous input signal level range to the present one, without risk of even partial integration at one range setting and pulse counting at a different one.

* * * * *